United States Patent [19]

Motomiya

[11] Patent Number: 4,597,291
[45] Date of Patent: Jul. 1, 1986

[54] CONNECTIBLE INSTRUMENT CASING

[75] Inventor: Takehiko Motomiya, Tokyo, Japan

[73] Assignee: Ohkura Electric Co., Ltd., Tokyo, Japan

[21] Appl. No.: 636,231

[22] Filed: Jul. 31, 1984

[30] Foreign Application Priority Data

Sep. 23, 1983 [JP] Japan .............. 58-146849[U]
Sep. 23, 1983 [JP] Japan .............. 58-146850[U]

[51] Int. Cl.⁴ .............................. G12B 9/02
[52] U.S. Cl. ................. 73/432 AD; 73/431; 361/395
[58] Field of Search .......... 73/431, 432 AD; 361/393, 394, 395

[56] References Cited

U.S. PATENT DOCUMENTS

| | | | |
|---|---|---|---|
| 2,995,686 | 8/1961 | Selvin | 361/394 X |
| 3,035,446 | 5/1962 | Ross | 73/432 AD |
| 3,383,653 | 5/1968 | Bolton et al. | 361/394 X |
| 3,768,314 | 10/1973 | Metzler et al. | 73/432 AD |
| 4,109,294 | 8/1978 | Mason et al. | 361/394 X |
| 4,342,002 | 7/1982 | Gabi | 361/394 X |

FOREIGN PATENT DOCUMENTS

| | | | |
|---|---|---|---|
| 2730229 | 1/1979 | Fed. Rep. of Germany | 73/432 AD |
| 2224970 | 10/1974 | France | 361/393 |
| 593141 | 10/1947 | United Kingdom | 73/431 |

Primary Examiner—Stewart J. Levy
Assistant Examiner—Tom Noland
Attorney, Agent, or Firm—Fleit, Jacobson, Cohn & Price

[57] ABSTRACT

The disclosed connectible instrument casing has holding grooves formed on an outer sidewall thereof and linear ridges snugly insertible in the holding grooves, whereby adjacent casings are connected by engaging the linear ridges with the holding grooves. Each casing preferably has opposing grooves located in the inner surface of its top and bottom walls for supporting and guiding a circuit board.

12 Claims, 10 Drawing Figures

TRANSMITTER-RECEIVER CIRCUITS

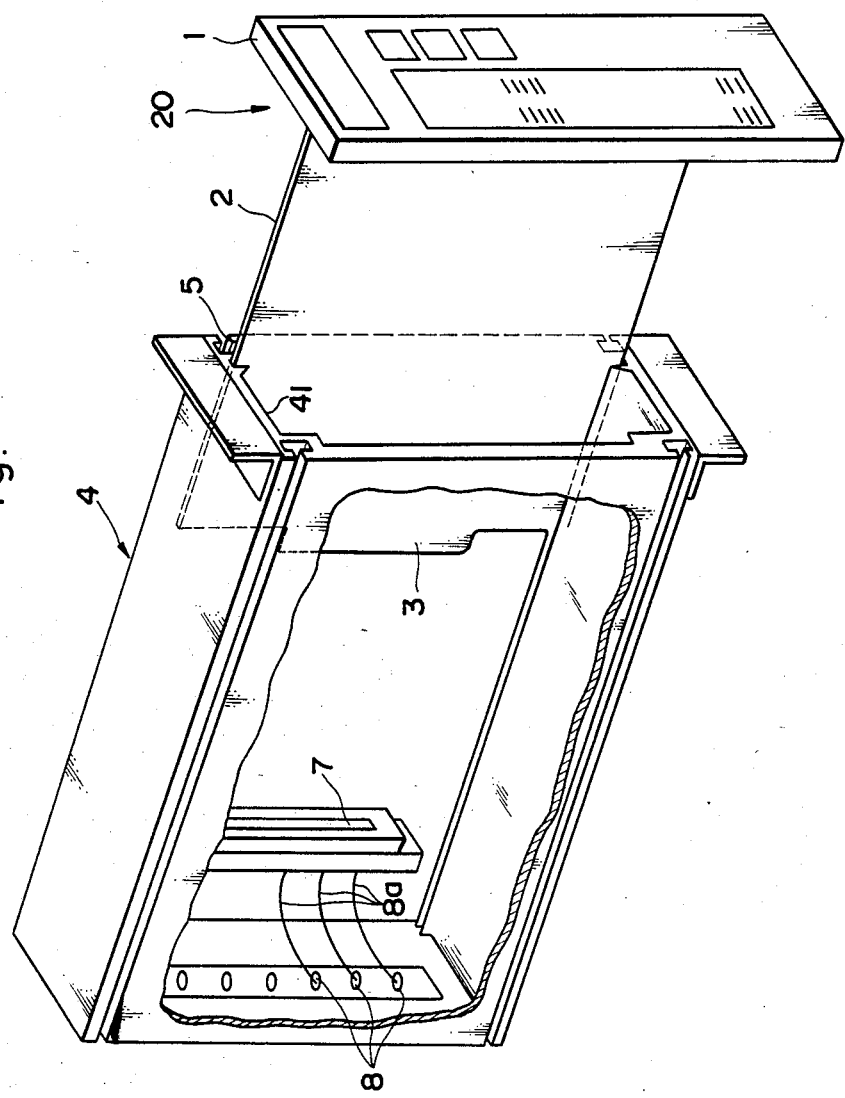

CONNECTIBLE INSTRUMENT CASING

BACKGROUND OF THE INVENTION

1. Field of the Invention

This invention relates to a connectible instrument casing. More particularly, the invention provides a connectible instrument casing which is suitable for easy assembling of a number of instruments at a low cost so as to form a multi-loop control system including a plurality of instruments and/or distributed automatic controllers. The instrument here refers to an indicating meter, a recording meter, a display, a switching means, an automatic controller with or without a meter, and the like.

2. Description of the Prior Art

In controlling the process of a typical plant, the overall process control system usually includes a plurality of control loops, and the case of having only one control loop is rather rare. The number of control loops in the process control system varies considerably depending on the kind and scale of the plant. The number of automatic controllers per control loop is not necessarily one. For instance, some cascade control systems use one automatic controller per two control loops. In general, the number of meters and automatic controllers in a process control system varies over a wide range depending on the scale and kind of the plant concerned, and the type of control also varies extensively plant by plant.

In the instrumentation and control system of the prior art, each of the meters required is placed in a separate casing and mounted on a panel one by one, or holes are cut on the panel so as to mount the required number of meters on the thus cut holes one by one. The need of separate casings for the individual meters has been one of causes to increase the cost of the conventional control system and instrumentation.

To avoid this difficulty, a common casing for a certain number of instruments has been proposed. For instance, FIG. 1 shows a common casing 52 for six instruments 51. However, such common casing for a predetermined number of instruments has a shortcoming in that, if the number of instruments to be housed in the casing exceeds the predetermined number only by a few, for instance, if seven or eight instruments 51 are to be housed in the casing 52 of FIG. 1, remodelling of the casing may become necessary. On the other hand, if less than the predetermined number of instruments are housed in such common casing, for instance, if only three instruments 51 are to be housed in the common casing 52 of FIG. 1, it becomes necessary to mount blind covers onto the unused portion of the casing 52. Such remodelling or mounting of the blind covers tends to cause an extra cost.

SUMMARY OF THE INVENTION

Therefore, an object of the present invention is to obviate the above shortcoming of the prior art by providing a novel connectible instrument casing of simple construction.

To fulfil the object, a large number of connectible instrument casings of identical construction according to the present invention are prepared and stored, and to meet the need of a specific plant, a suitable number of such connectible instrument casings are assembled so as to form an assembled housing which is just sufficient for housing the required number of instruments or control loops at the specific plant.

An embodiment of the connectible instrument casing according to the present invention has a peripheral wall with a sideway U-shaped cross section formed of a top wall, a bottom wall, and a side wall extending therebetween. A pair of guide grooves may be formed on inner surfaces of the peripheral wall, e.g., on the inner surfaces of the top wall and the bottom wall, so as to guide a circuit board between the top wall and the bottom wall. The circuit board may carry an instrument panel secured thereto in such a manner that, when the circuit board is held in position between the top wall and the bottom wall, the instrument panel is fitted in a front end opening of the peripheral wall.

A pair of holder grooves are formed on the outer surface of the sidewall along longitudinal edges of the top wall and the bottom wall, while a pair of linear ridges are formed on free ends of the top wall and the bottom wall. Each of the linear ridges is insertible in the holder groove in a longitudinal direction thereof but inseparable from the holder groove in a direction lateral to the longitudinal direction once inserted therein. Accordingly, an arbitrary number of the connectible instrument casings can be integrally assembled simply by inserting the linear ridges of each casing in the holding grooves of the adjacent casing. After such assembling, two sides of each casing are closed, one side by its own sidewall and the other side by the sidewall of the adjacent casing, except the extreme end casing which has the linear edges thereof left free.

To block the opening between the free linear edges of the extreme end casing of the thus assembled casings, a closing sidewall member with similar holding grooves to the those of the individual casing may be used. More particularly, the side opening of the extreme end casing of the assembled casings can be blocked with the above-mentioned closing sidewall member by inserting the linear edges of the former in the holding grooves of the latter.

Instead of using the closing sidewall member, a special connectible instrument casing with a closed rectangular cross section may be used at the extreme end of an assembly of the connectible instrument casings having a sideway U-shaped cross section except the extreme end.

A connectible instrument casing according to the present invention may have a rear wall which closes the rear end opening of the peripheral wall, and at least a pair of jacks are mounted on the rear wall, which pair of jacks are connected to each other by a communication line extending therebetween. A plug having at least a pair of electrically connected contact rods may be inserted in the jacks of adjacent casings, so that the adjacent casings can be electrically connected. A transmitter-receiver circuit may be placed in each casing and connected to the communication line therein, so as to facilitate interconnection among the instruments in the casings thus assembled.

Another embodiment of the connectible instrument casing according to the invention has a peripheral wall with a rectangular cross section defined by a top wall, a bottom, and two sidewalls. Guide grooves may be formed on inner surface of the peripheral wall so as to guide a circuit board between the top wall and the bottom wall, and an instrument panel may be secured to the circuit board in such a manner that it may fit in a front end opening of the peripheral wall when the circuit board is held in position by the guide grooves.

Holder grooves are formed on outer surfaces of the sidewalls at opposite longitudinal edges of the top wall and the bottom wall.

To connect two such casings, the two casings are placed side by side so as to cause the holding grooves thereof face to each other, and a coupler having a pair of linear ridges at opposite edges thereof is inserted in the thus facing holding grooves of the adjacent connectible instrument casings. Each of the linear ridges of the coupler is insertible in the holder groove in the longitudinal direction thereof but inseparable from the holder groove in a direction lateral to the longitudinal direction once inserted therein.

BRIEF DESCRIPTION OF THE DRAWINGS

For a better understanding of the invention, reference is made to the accompanying drawings, in which:

FIG. 8 is a partially cutaway schematic perspective view of another embodiment of the connectible instrument casing according to the present invention.

Like parts are designated by like numerals and symbols throughout different views of the drawings.

DESCRIPTION OF THE PREFERRED EMBODIMENT

Figure 1:
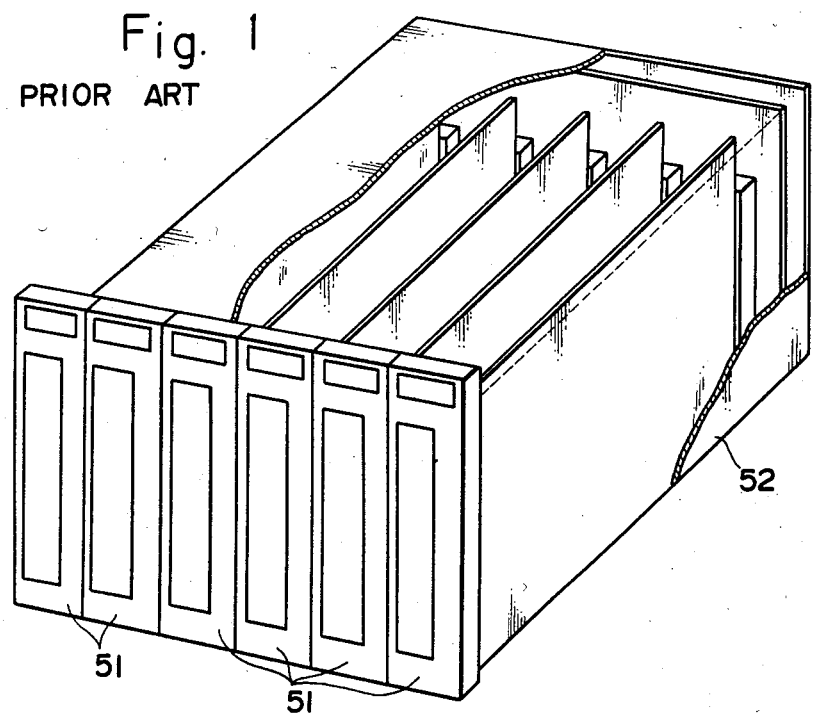
FIG. 1 is a partially cutaway schematic perspective view of a common casing of the prior art, which common casing houses a plurality of instruments.
Figure 3:
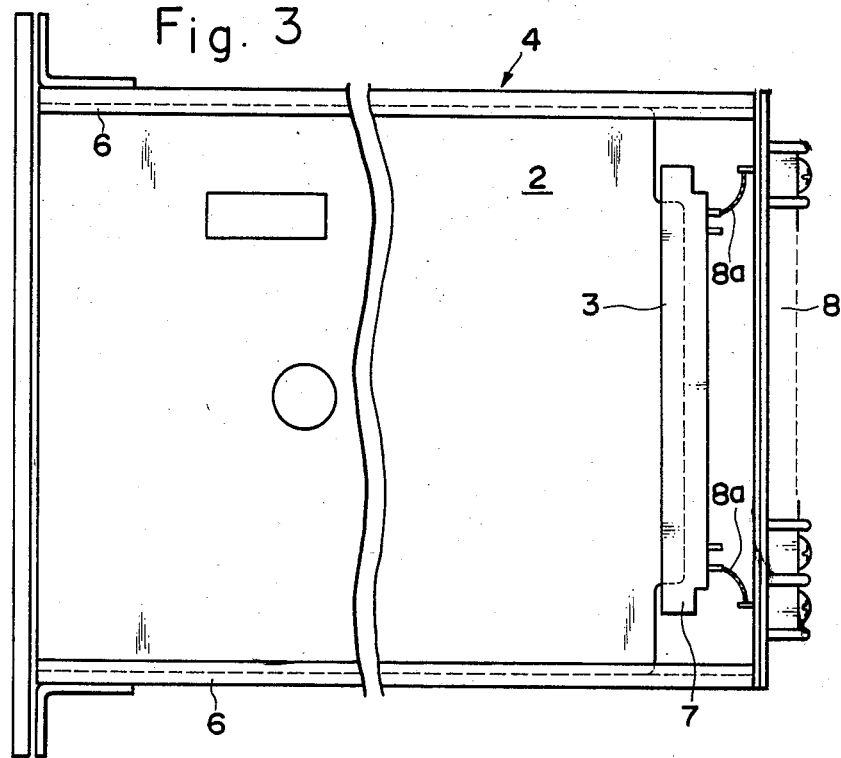
FIG. 3 is a schematic side view of the connectible instrument casing of FIG. 2.
Figure 2:
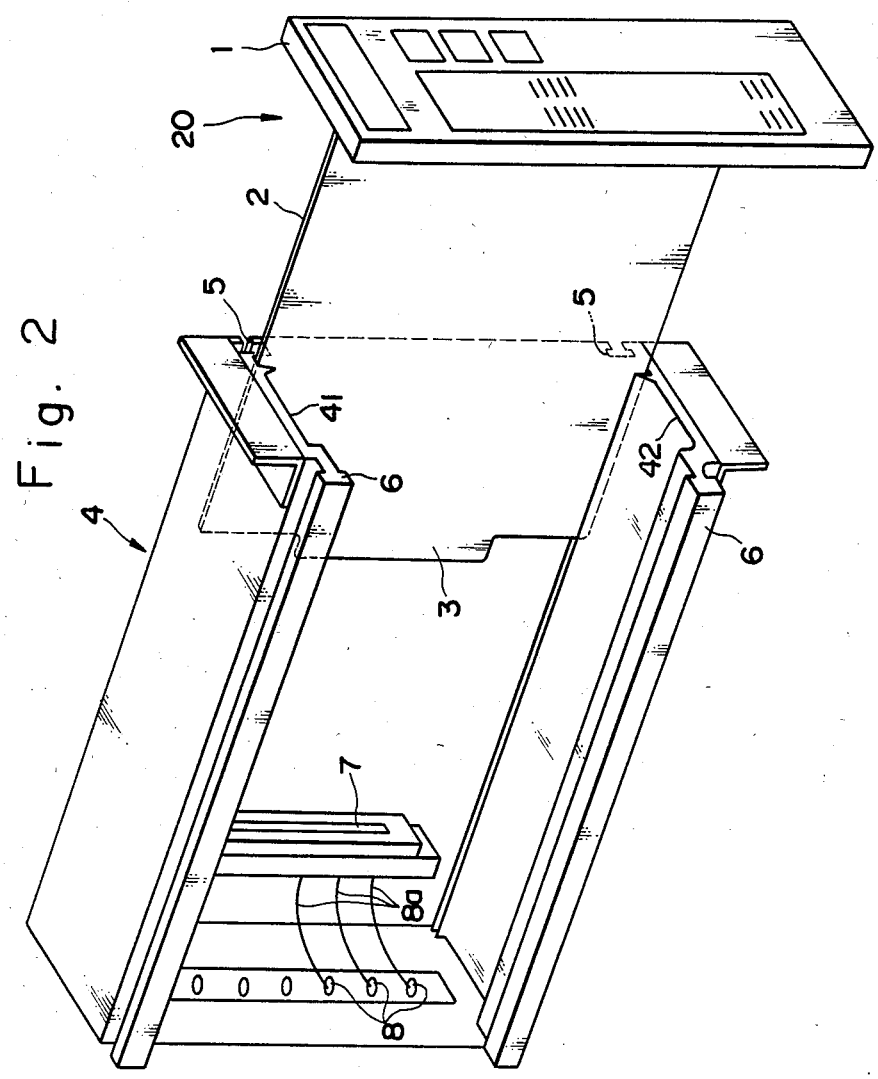
FIG. 2 is a partially cutaway schematic perspective view of an embodiment of the connectible instrument casing according to the present invention.

Referring to FIG. 2 showing a schematic perspective view of a preferred embodiment of the connectible instrument casing of the invention and FIG. 3 showing a side view of the same, an instrument panel 1 carries one or more instruments, such as indicating meters, recording meters, displays, controllers, switches, and the like. A circuit board 2 holds the internal electric circuits of the instruments mounted on the panel 1. In the illustrated embodiment, the circuit board 2 is a printed circuit board, but the present invention is not limited to the use of such printed circuit board. The instrument panel 1 and the circuit board 2 are integrally secured to each other so as to form an instrument proper 20.

The circuit board 2 of the illustrated embodiment has a plug portion 3 integrally formed at one end thereof, and electric terminals for the electric circuit of the board 2 are formed on the plug portion 3.

Figure 4A:
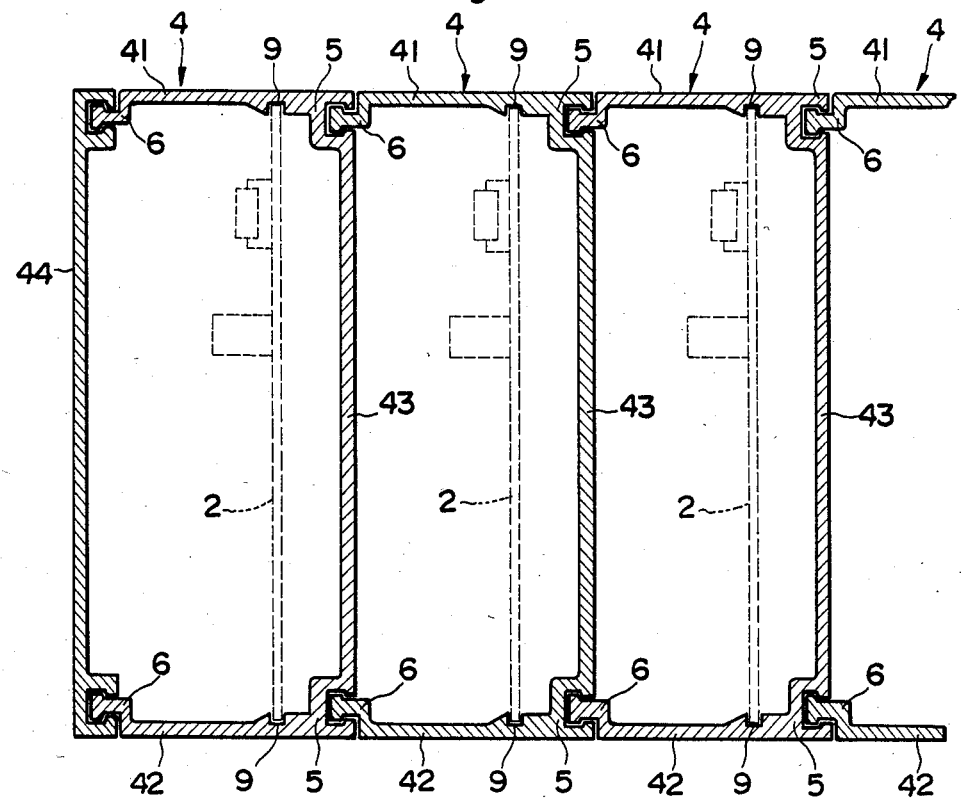
FIG. 4A and FIG. 4B are schematic sectional views showing the manner in which the instrument casings of FIG. 2 are assembled.

Referring to FIG. 4A showing the manner in which a plurality of the connectible instrument casings 4 of the present invention are joined, the circuit board 2 is held between the top wall 41 and the bottom wall 42 of each connectible instrument casing 4. Both the top wall 41 and the bottom wall 42 are rigidly connected to the sidewall 43, so that the peripheral wall of the illustrated embodiment of the connectible instrument casing 4 has a sideway U-shaped cross section.

Holding grooves 5 are formed on the outer surface of the sidewall 43 at about the levels of the top wall 41 and the bottom wall 42, or along the longitudinal edges of the top wall 41 and the bottom wall 42. Each holding groove 5 preferably has an enlarged bottom portion. Linear ridges 6 are formed along the free edges of the farthest edges from the sidewall 43 of both the top wall 41 and the bottom wall 42. Each of the linear ridges 6 preferably has an enlarged tip or a dovetail-shaped cross section. Thus, the linear ridge 6 can be inserted into the holding groove 5 in the longitudinal direction thereof, but the ridge 6 is inseparable from the holding groove 5 in a direction lateral to the longitudinal direction once it is inserted in the holding groove 5.

A jack portion 7, which is adapted to receive the plug portion 3 of the circuit board 2 upon insertion thereof, is electrically connected to a terminal board 8 of the casing 4 for external connection. In the illustrated embodiment, in order to prevent the above-mentioned electric connection from being interrupted when the instrument board 2 is removed from the casing 4, flexible lead wires 8a are used for making the connections between the terminal board 8 and the jack portion 7. Thus, the jack portion 7 can move while carrying the plug portion 3 of the circuit board 2 therewith, and the circuit board 2 is always connected to the outside circuit through the plug portion 3, the jack portion 7 and the terminal board 8. To securely hold the circuit board 2, guide grooves 9 are formed on the inside surfaces of the top wall 41 and the bottom wall 42 of the connectible instrument casing 4.

For actual use, each instrument can be fabricated simply by mounting the instrument proper 20 formed of the instrument panel 1 and the circuit board 2 onto the connectible instrument casing 4 through the insertion of the circuit board 2 in the guide grooves 9. To join the adjacent instruments, it is sufficient to insert the linear ridges 6 of the casing 4 of one instrument into the holding grooves 5 of the casing 4 of the other instrument, so as to couple the linear ridges 6 with the holding grooves 5. When the holding groove 5 has the enlarged bottom and the linear ridge 6 has the enlarged tip or the dovetail-shaped cross section, the simple insertion of the linear ridge 6 in the holding groove 5 renders the desired joint.

To assemble three or more instruments, it is sufficient to repeat the above-mentioned coupling between the connectible instrument casings 4 of the adjacent instruments one by one.

Thus, according to the present invention, a metering or controlling panel having an arbitrary number of instruments can be easily provided by having a stock of the connectible instrument casings 4 of simple and identical structure and the instrument propers 20 and by assembling the required number of the casings 4 and the instrument propers 20 in the manner described above. The connectible instrument casing 4 of the invention not only facilitates the handling and the assembling of the instruments, but also renders considerable savings in the manufacturing cost.

Referring to FIG. 4A, when it is necessary to block the side opening of the sideway U-shaped peripheral wall of the connectible instrument casing 4, a closing sidewall member 44 having the same holding grooves 5 as those of the sidewall 43 may be used. More particularly, the linear ridges 6 at the free edges of the top and bottom walls 41, 42 of the casing 4 are inserted in the holding grooves 5 of the closing sidewall member 44, so that the side opening of the casing 4 is blocked as shown in FIG. 4A.

Figure 4B:
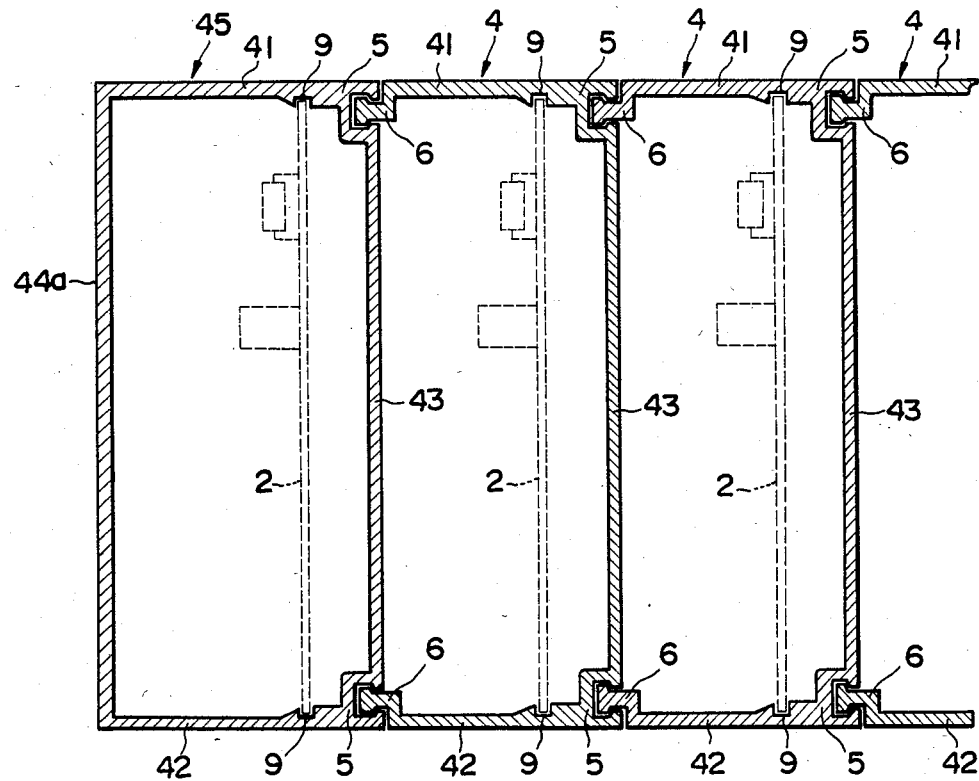

Instead of the blocking by the closing sidewall member 44, an end casing 45 can be used as shown in FIG. 4B. In addition to the top wall 41, the bottom wall 42 and the sidewall 43 with the holding grooves 5, the end casing 45 has a flat sidewall 44a extending between the opposite edges of the top wall 41 and the bottom wall 42 to the sidewall 43. Thus, the peripheral wall of the end casing 45 has a closed rectangular cross section.

With the closing sidewall member 44 or the end casing 45, the assembly of the connectible instrument casings 4 becomes free from projections formed of the linear ridges 6 at one end thereof. Whereby, satisfactory safety and appearance of the assembly of the casings 4 can be ensured.

Figure 6:
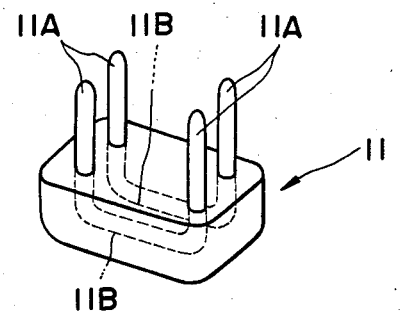
FIG. 6 is a schematic perspective view of a plug to be used with the assembly of FIG. 5.
Figure 7:
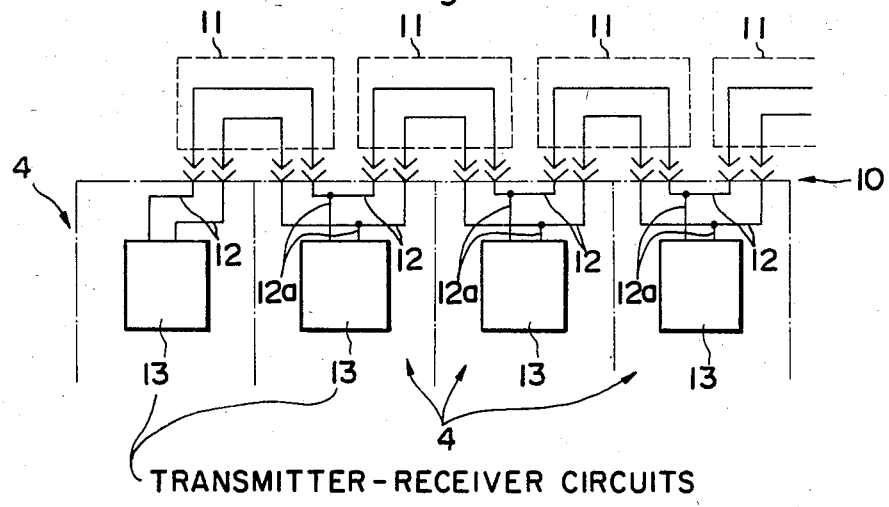
FIG. 7 is an electric circuit diagram of communication lines provided in the connectible instrument casings according to the present invention and plugs for interconnecting the communication lines.
Figure 5:
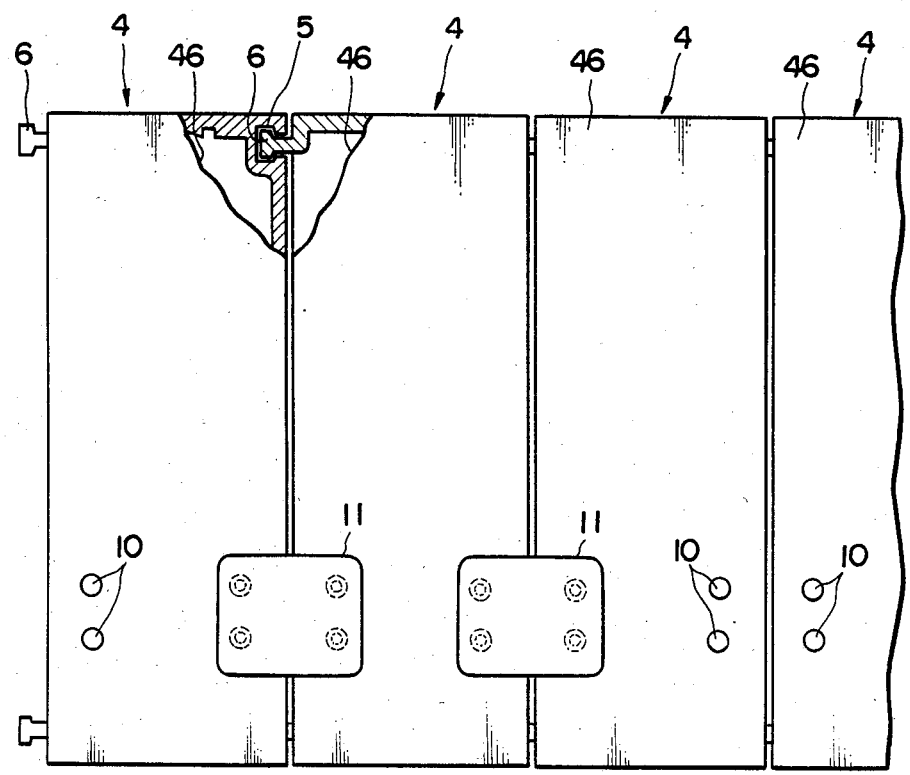
FIG. 5 is a partially cutaway schematic view showing the rear end of an assembly of the connectible instrument casings representing another embodiment of the present invention.

With the progress of the control technology, there is an increasing demand for communication lines among different controllers and control loops, so as to transmit parameters among them for effecting desired control while coordinating such controllers and control loops. It is an important feature of the invention that such communication line can be provided very easily. Referring to FIG. 5 through FIG. 7, a rear wall member 46 is attached to each of the connectible instrument casings 4, so as to block the rear end opening of the peripheral wall of the casing 4 between the top wall 41 and the bottom wall 42.

At least a pair of jacks 10, two pairs in the illustrated embodiment, are mounted on the rear wall member 46. The jacks 10 of the adjacent casings 4 are electrically connected by a plug 11. Each pair of the jacks 10 in one casing 4 are connected to each other by a communication line 12, such as a party line. A transmitter-receiver circuit 13 may be disposed in the casing 4 and connected to the communication line 12 by a lead wire 12a.

Each plug 11 has contact rods 11A which are adapted to be simultaneously insertible to the jacks 10 of the adjacent casings 4, and conductors 11B connecting contact rods 11A insertible to jacks 10 of the adjacent casings 4. It is apparent to those skilled in the art that a communication system as shown in FIG. 7, such as a party line type communication system, can be formed by the jacks 10 and the plugs 11. The jacks 10, plugs 11, and the communication lines 12 are not restricted to those for electric signals, and in fact those for optical signals can be also used in the present invention. The communication lines 12 of FIG. 7 can be also used as common power source lines.

Figure 9:
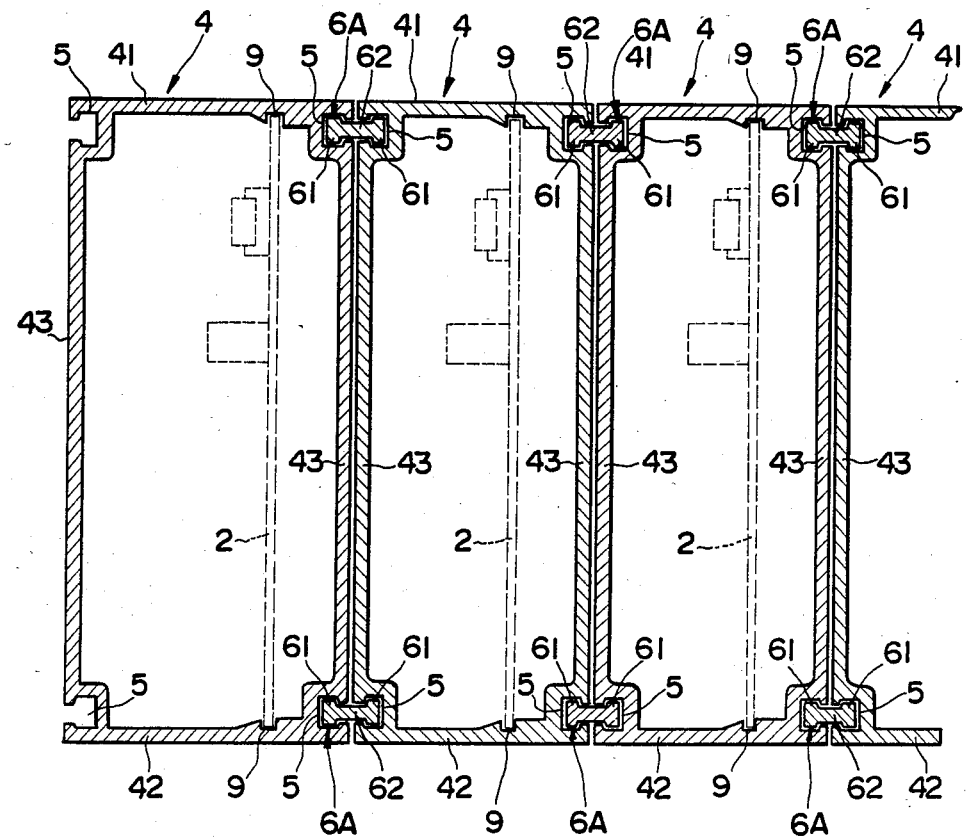
FIG. 9 is a schematic sectional view of an assembly of the connectible instrument casings of FIG. 8, showing the manner in which such casings are connected to each other.

FIG. 8 and FIG. 9 show another embodiment of the connectible instrument casing 4 of the invention. The peripheral wall of the casing 4 of this embodiment has a closed rectangular cross section formed of a top wall 41, a bottom wall 42, and two parallel sidewalls 43 which connect the top and bottom walls 41, 42. Holding grooves 5 similar to those of the preceding embodiment of FIG. 2 are formed on the outer surfaces of the sidewalls 43 at positions corresponding to longitudinal edges of the top wall 41 and the bottom wall 42. When two such casings 4 are placed side by side, the holding grooves 5 thereof face toward each other, as shown in FIG. 9.

A coupler 6A is inserted in the two facing holding grooves 5 of the adjacent casings 4. The coupler 6A has a pair of linear ridges 61 integrally formed along opposite edges of a joining portion 62. Each linear ridge 61 snugly fits in the holding groove 5, so as to couple the adjacent casings 4 by the joining portion 62 having the linear ridges 61 integrally formed therewith. Preferably, the holding groove 5 has an enlarged bottom portion, while the linear ridge 61 has a dovetail cross section which mates with the holding groove 5.

As described in the foregoing, a connectible instrument casing according to the present invention has holding grooves formed on the outer surface of the peripheral wall thereof and linear ridges insertible therein but inseparable in lateral direction, so that the following features can be achieved.

(1) If a stock of a number of the connectible instrument casings of identical structure is maintained together with a stock of the instrument propers, an arbitrary number of instruments can be assembled very easily and very quickly.

(2) The conventional need of separate casings for individual instruments and an additional casing for an assembly of the instruments can be eliminated, so that the invention enables an economic saving.

(3) It is made easy to modify, add, or remove meters and controllers in a centralized metering or controlling assembly, so that optimal performance of a plant can be achieved comparatively easily.

(4) It facilitates standardization of the instrument casing, and the handling and production of instrument casings can be simplified by standardization.

(5) A safe assembly of a number of instruments with good outlook can be produced simply by coupling the connectible instrument casings carrying the instrument propers.

(6) If necessary, communication lines or common power source lines can be incorporated in the connectible instrument casings without interfering with the connectible structure thereof.

I claim:

1. A connectible instrument casing, comprising:
   a peripheral wall having a top wall, a bottom wall, and a sidewall extending between said top wall and said bottom wall so as to define an inside space with a substantially rectangular cross section;
   holder grooves formed on an outer surface of said sidewall along the longitudinal edges of said top wall and said bottom wall; and
   coupler means having linear ridges formed along the edges of said top wall and said bottom wall on opposite side to said sidewall, said linear ridges of said instrument casing being insertible in corresponding holder grooves of an adjacent casing identical with said casing in a longitudinal direction thereof but inseparable from said holder groove of said adjacent casing in a direction lateral to said longitudinal direction once inserted therein.

2. A connectible instrument casing as set forth in claim 1 and further comprising guide grooves formed on inner surface of said peripheral wall so as to guide a circuit board between said top wall and said bottom wall, and an instrument panel secured to said circuit board so as to be fitted in a front end opening of said peripheral wall.

3. A connectible instrument casing adapted to be coupled to an identical casing therewith so as to form an assembly of the instrument casings, comprising:
- a peripheral wall having a top wall, a bottom wall, and a sidewall therebetween so as to define a sideway U-shaped cross section;
- two holder grooves formed on an outer surface of said sidewall along the longitudinal edges of said top wall and said bottom wall respectively; and
- linear ridges formed on opposite ends of said top wall and said bottom wall to said sidewall, each of said linear ridges of said instrument casing being insertible in the corresponding holder grooves of an adjacent casing identical with said casing in a longitudinal direction thereof but inseparable from said holder groove in a direction lateral to said longitudinal direction once inserted therein.

4. A connectible instrument casing as set forth in claim 3 and further comprising guide grooves formed on inner surface of said peripheral wall so as to guide a circuit board between said top wall and said bottom wall, and an instrument panel secured to said circuit board so as to be fitted in a front end opening of said peripheral wall.

5. A connectible instrument casing as set forth in claim 3, wherein said casing further comprises a closing side wall member having grooves adapted to snugly receive said linear ridges formed on free edges of said top wall and said bottom wall.

6. A connectible instrument casing as set forth in claim 3, wherein said peripheral wall has another sidewall extending between said top wall and said bottom wall.

7. A connectible instrument casing as set forth in claim 3, wherein said casing further comprises:
- a rear wall closing a rear end opening of said peripheral wall;
- at least a pair of jacks mounted on said rear wall;
- a communication line extending between said pair of jacks; and
- a plug having at least a pair of contact rods including one rod insertible in one of said jacks of said casing and another rod insertible in a corresponding jack of an adjacent casing identical with said casing and conductors connecting said contact rods in each pair.

8. A connectible instrument casing as set forth in claim 7, wherein said casing further comprises a transmitter-receiver circuit connected to said communication line.

9. A connectible instrument casing adapted to be coupled to an identical casing therewith so as to form an assembly of the instrument casings, comprising:
- a peripheral wall having a top wall, a bottom wall, and two sidewalls;
- holder grooves formed on the outer surfaces of said sidewalls at opposite longitudinal edges of said top wall and said bottom wall; and
- at least one coupler having a pair of linear ridges formed along opposite edges thereof, said pair of ridges being insertible in a corresponding pair of said holder grooves of said casing and a corresponding holder groove of an adjacent casing identical with said casing respectively in a longitudinal direction thereof but inseparable from said holder groove in a direction lateral to the longitudinal direction once inserted therein, whereby said casing is coupled with said adjacent casing.

10. A connectible instrument casing as set forth in claim 9 and further comprising guide grooves formed on inner surface of said peripheral wall so as to guide a circuit board between said top wall and said bottom wall, and an instrument panel secured to said circuit board so as to be fitted in a front end opening of said peripheral wall.

11. A connectible instrument casing as set forth in claim 9, wherein said casing further comprises:
- a rear wall closing a rear end opening of said peripheral wall;
- at least a pair of jacks mounted on said rear wall;
- a communication line extending between said pair of jacks; and
- a plug having at least a pair of contact rods including one rod insertible in one of said jacks of said casing and another rod insertible in a corresponding jack of an adjacent casing identical with said casing and conductors connecting said contact rods in each pair.

12. A connectible instrument casing as set forth in claim 11, wherein said casing further comprises a transmitter-receiver circuit connected to said communication line.

* * * * *